(12) United States Patent
Kruiskamp

(10) Patent No.: US 10,965,250 B1
(45) Date of Patent: Mar. 30, 2021

(54) SWITCHED CAPACITOR CRYSTAL OSCILLATOR

(71) Applicant: Dialog Semiconductor B.V., 's-Hertogenbosch (NL)

(72) Inventor: Marinus Wilhelmus Kruiskamp, 's-Hertogenbosch (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/739,552

(22) Filed: Jan. 10, 2020

(51) Int. Cl.
  *H03B 5/36* (2006.01)

(52) U.S. Cl.
  CPC ....... *H03B 5/36* (2013.01); *H03B 2200/0012* (2013.01)

(58) Field of Classification Search
  CPC ........................................................ H03B 5/36
  USPC ....................................................... 331/116 R
  See application file for complete search history.

(56) References Cited

U.S. PATENT DOCUMENTS

| | | | | |
|---|---|---|---|---|
| 4,492,935 A | * | 1/1985 | Fleischer | H03B 5/06 331/135 |
| 4,941,156 A | * | 7/1990 | Stern | G06F 5/10 331/158 |
| 2005/0083139 A1 | | 4/2005 | Gazit | |
| 2009/0261914 A1 | | 10/2009 | Kao | |
| 2011/0037526 A1 | * | 2/2011 | Sato | H03B 5/36 331/116 R |
| 2011/0241791 A1 | | 10/2011 | Hung | |
| 2012/0098609 A1 | * | 4/2012 | Verma | H03B 5/36 331/158 |

OTHER PUBLICATIONS

"High-performance Crystal Oscillator Circuits: Theory and Application," by Eric A. Vittoz et al., IEEE Journal of Solid-State Circuits, vol. 23, No. 3, Jun. 1988, pp. 774-783.
U.S. Office Action, U.S. Appl. No. 16/739,567, Appliants: Verhoef et al., dated May 8, 2020, 15 pages.

* cited by examiner

*Primary Examiner* — Joseph Chang
(74) *Attorney, Agent, or Firm* — Saile Ackerman LLC; Stephen B. Ackerman

(57) ABSTRACT

This document presents an oscillator circuit and method. The oscillator circuit has a crystal to generate an oscillating voltage signal, a load capacitor coupled to the crystal, a capacitive element, and a switching circuit. The switching circuit alternately connects the capacitive element to the load capacitor and disconnects the capacitive element from the load capacitor. The presented oscillator circuit shows the advantages of a lower power consumption and a smaller circuit area.

24 Claims, 15 Drawing Sheets

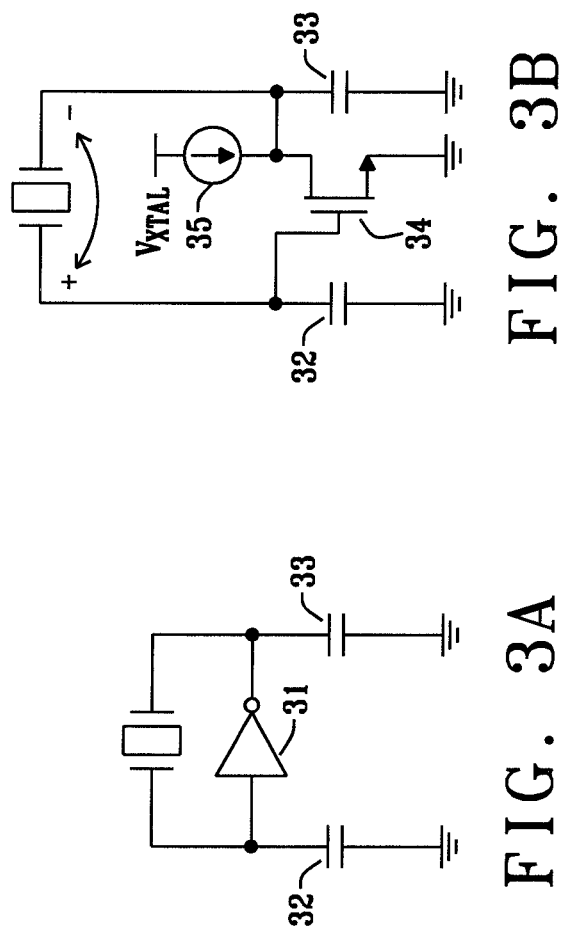

SWITCHED CAPACITOR CRYSTAL OSCILLATOR

TECHNICAL FIELD

The present document relates to oscillator circuits. More specifically, the present document relates to oscillator circuits based on quartz crystals for generating reference signals from which radio frequency (RF) signals compliant with the Bluetooth Low Energy (BLE) standard may be generated.

BACKGROUND

The Pierce oscillator is a frequently used electronic circuit that produces a periodic, oscillating signal. Typical application scenarios include RF applications or clock generators for generating clock signals in integrated circuits. The Pierce oscillator typically comprises an active element (such as an inverter), two capacitors, and a quartz crystal. However, there are still a few limitations and drawbacks of this frequently used oscillator architecture: The two capacitors require a substantial amount of circuit area, the active element increases the overall power consumption of the oscillator, and the Pierce oscillator is sensitive towards parasitic capacitances over the quartz crystal.

SUMMARY

The present document addresses the above mentioned technical problems. In particular, the present document addresses the technical problem of providing a novel type of oscillator circuit which is smaller and has reduced power consumption compared to the conventional Pierce architecture.

According to an aspect, an oscillator circuit is presented. The oscillator circuit may comprise a crystal configured to generate an oscillating voltage signal, a load capacitor coupled to the crystal, a capacitive element, and a switching circuit. The switching circuit may be configured to alternately connect the capacitive element to the load capacitor and disconnect the capacitive element from the load capacitor.

The described oscillator circuit may be denoted as "switched capacitor oscillator" circuit since the capacitive element is repeatedly connected to and disconnected from the load capacitor. The capacitive element may be e.g. a capacitor. In general, the capacitive element may be a passive electronic component capable of storing electrical energy in an electric field. The capacitive element may comprise a first terminal and a second terminal. Unlike solutions known from the prior art, the proposed oscillator circuit may primarily comprise passive electronic components and may not comprise active electronic components such as e.g. inverters or current sources. Compared to known solutions such as e.g. the Pierce oscillator, the presented switched capacitor oscillator shows the advantages of lower power consumption and smaller circuit area. Moreover, the proposed oscillator circuit is less sensitive with regard to parasitic capacitances of the crystal.

The switching circuit may comprise one or more switching elements. Each switching element may be implemented with any suitable device, such as, for example, a metal-oxide-semiconductor field effect transistor MOSFET, or other suitable transistors. Each switching element may have a gate to which a respective driving voltage or control signal may be applied to turn the switching element on (i.e. to close the switching element) or to turn the switching element off (i.e. to open the switching element).

The crystal may e.g. comprise a quartz crystal. The load capacitor may be coupled in parallel with the crystal. The switching circuit may be configured to connect the capacitive element in parallel with the load capacitor.

The oscillating voltage signal may be e.g. a sine wave voltage signal oscillating around an average voltage value which may be e.g. 0V. A maximum voltage value of the oscillating voltage signal may also be denoted as peak voltage, and a minimum voltage value of the oscillating voltage signal may also be denoted as valley voltage.

For example, the oscillator circuit may be used for generating an accurate, fixed reference frequency. From this reference frequency, signals in the RF range of about 100 kHz to 100 GHz may be generated using phase locked loops (PLL) or delay locked loops (DLL). More specifically, the oscillator circuit may be used to derive RF signals for radio communication standards such as e.g. the BLE standard. Another application of the proposed oscillator circuit is in real-time clocks. In general, the load capacitor (or alternatively the load capacitor and the capacitive element) may be selected to tune a resonance frequency of the oscillator circuit to a desired value depending on the application scenario.

The switching circuit may be configured to alternately connect and disconnect said capacitive element to and from the load capacitor such that the oscillating voltage signal continues oscillating with a given amplitude. Every time the capacitive element is connected to the load capacitor, the charge stored on the capacitive element may redistribute, and energy may be added to the oscillation which compensates for the losses in the crystal. As will be discussed in the following paragraphs, the capacitive element may be recharged during times when the capacitive element is disconnected from the load capacitor.

The switching circuit may comprise a first switching element configured to connect a first terminal of the capacitive element to a first terminal of the load capacitor. The switching circuit may comprise a second switching element configured to connect a second terminal of the capacitive element to a second terminal of the load capacitor. Moreover, the switching circuit may comprise a third switching element configured to connect the first terminal of the capacitive element to a first terminal of a power source. The switching circuit may comprise a fourth switching element configured to connect the second terminal of the capacitive element to a second terminal of the power source. The third switching element and the fourth switching element may enable charging the capacitive element with a first polarity. For example, the first terminal of the power source may be the supply terminal of the power source, and the second terminal of the power source may be the reference terminal of the power source. Alternatively, the first terminal of the power source may be the reference terminal of the power source, and the second terminal of the power source may be the supply terminal of the power source.

For instance, the oscillator circuit may comprise said power source. In general, the power source may comprise the supply terminal providing a supply voltage and the reference terminal providing a reference voltage. At this, the reference terminal may be e.g. ground and the reference voltage may be defined as 0V. In this regard, the skilled person understands that ground may not necessarily be a physical connection to earth. Instead, the reference node may be an arbitrary node to and from which currents may flow and from which voltages are measured.

Furthermore, the switching circuit may comprise a fifth switching element configured to connect the first terminal of the capacitive element to the second terminal of the power source. The switching circuit may comprise a sixth switching element configured to connect the second terminal of the capacitive element to the first terminal of the power source. Thus, the fifth switching element and the sixth switching element may enable charging the capacitive element with a second polarity, wherein said second polarity is reversed with regard to the above-mentioned first polarity.

Furthermore, the switching circuit may comprise a seventh switching element configured to connect the first terminal of the capacitive element to the second terminal of the load capacitor. The switching circuit may comprise an eighth switching element configured to connect the second terminal of the capacitive element to the first terminal of the load capacitor.

The switching circuit may be configured to, after disconnecting the capacitive element from the load capacitor, connect the capacitive element to the power source for charging the capacitive element. The switching circuit may also be configured to disconnect the capacitive element from the power source before connecting the capacitive element to the load capacitor.

The oscillator circuit may be configured to charge the capacitive element and connect the capacitive element to the load capacitor such that the oscillating voltage signal is (temporarily) increased when the oscillating voltage signal has a maximum voltage value or when the oscillating voltage signal is decreasing. Alternatively or additionally, the oscillator circuit may be configured to charge the capacitive element and connect the capacitive element to the load capacitor such that the oscillating voltage signal is (temporarily) decreased when the oscillating voltage signal has a minimum voltage value or when the oscillating voltage signal is increasing.

This behaviour of the oscillator circuit may be achieved in at least two different ways: According to the first alternative, a positively charged capacitive element may be connected to the load capacitor when the oscillating voltage signal has a maximum voltage value or when the oscillating voltage signal is decreasing, and negatively charged capacitive element may be connected to the load capacitor when the oscillating voltage signal has a minimum voltage value or when the oscillating voltage signal is increasing. In other words, the switching circuit may be configured to charge the capacitive element by connecting the capacitive element with a first polarity to a power source before connecting the capacitive element to the load capacitor when the oscillating voltage signal has the maximum voltage value or when the oscillating voltage signal is decreasing. Additionally or alternatively, the switching circuit may be configured to charge the capacitive element by connecting the capacitive element with a second polarity to the power source before connecting the capacitive element to the load capacitor when the oscillating voltage signal has the minimum voltage value or when the oscillating voltage signal is increasing. At this, the first polarity may be reversed with regard to the second polarity. For example, connecting the capacitive element with the first polarity to the power source may be done using the third switching element and the fourth switching element, and connecting the capacitive element with the second polarity to the power source may be done using the fifth switching element and the sixth switching element, or vice versa.

According to the second alternative, the capacitive element may be always charged in the same manner by the power source, but may be connected to the load capacitors using one of two different polarities, depending on the slope of the oscillating voltage signal at the time when the capacitive element is connected to the load capacitor. In other words, the switching circuit may be configured to connect the capacitive element with a first polarity to the load capacitor when the oscillating voltage signal has the maximum voltage value or when the oscillating voltage signal is decreasing. Additionally or alternatively, the switching circuit may be configured to connect the capacitive element with a second polarity to the load capacitor when the oscillating voltage signal has the minimum voltage value or when the oscillating voltage signal is increasing. Again, the first polarity may be reversed with regard to the second polarity. For example, connecting the capacitive element with the first polarity to the load capacitor may be done using the first switching element and the second switching element, and connecting the capacitive element with the second polarity to the load capacitor may be done using the seventh switching element and the eighth switching element, or vice versa.

The oscillator circuit may comprise another capacitive element. The switching circuit may be configured to connect, when the oscillating voltage signal has a maximum voltage value or when the oscillating voltage signal is decreasing, the capacitive element to the load capacitor (and disconnect the other capacitive element from the load capacitor). The switching circuit may be configured to connect, when the oscillating voltage signal has a minimum voltage value or when the oscillating voltage signal is increasing, the other capacitive element to the load capacitor (and disconnect the capacitive element from the load capacitor). The oscillator circuit may be configured to simultaneously charge both the capacitive element and the other capacitive element (when the latter capacitive elements are disconnected from the load capacitor) using the same power source. For example, the oscillator circuit may be configured to charge both the capacitive element and the other capacitive element by connecting both capacitive elements to the supply terminal and the reference terminal of the same power source. By using two capacitive elements in an alternating fashion as describe above, it becomes possible to improve the oscillator circuit's robustness with regard to noise and voltage variations on the supply voltage.

The oscillator circuit may comprise an extreme voltage detection unit configured to detect a first-time instance at which the oscillating voltage signal reaches the maximum voltage value. The extreme voltage detection unit may be configured to detect a second time instance at which the oscillating voltage signal reaches the minimum voltage value. Further, the extreme voltage detection unit may be configured to determine a differentiated signal by differentiating the oscillating voltage signal. The extreme voltage detection unit may be configured to detect a zero-crossing of the differentiated signal.

According to another aspect, a method of operating an oscillator circuit is described. The method may comprise steps which correspond to the features of the oscillator circuit described in the present document. The oscillator circuit may comprise a crystal for generating an oscillating voltage signal, a load capacitor coupled to the crystal, and a capacitive element. The method may comprise connecting, by a switching circuit, the capacitive element to the load capacitor. The method may also comprise disconnecting, after said connecting, by the switching circuit, the capacitive element from the load capacitor.

The method may comprise alternately connecting and disconnecting, by said switching circuit, said capacitive element to and from the load capacitor such that the oscillating voltage signal continues oscillating with a given amplitude. In other words, the method may comprise transferring energy from the capacitive element to the crystal for compensating energy losses within the crystal.

The switching circuit may comprise a first switching element and a second switching element. The method may comprise connecting, by the first switching element, a first terminal of the capacitive element to a first terminal of the load capacitor, and connecting, by the second switching element, a second terminal of the capacitive element to a second terminal of the load capacitor.

The switching circuit may comprise a third switching element and a fourth switching element. The method may comprise connecting, by the third switching element, the first terminal of the capacitive element to a first terminal of a power source, and connecting, by the fourth switching element, the second terminal of the capacitive element to a second terminal of the power source.

The switching circuit may comprise a fifth switching element and a sixth switching element. The method may comprise connecting, by the fifth switching element, the first terminal of the capacitive element to the second terminal of the power source, and connecting, by the sixth switching element, the second terminal of the capacitive element to the first terminal of the power source.

The method may comprise connecting, by the switching circuit, after disconnecting the capacitive element from the load capacitor, the capacitive element to the power source for charging the capacitive element.

The method may comprise disconnecting, by the switching circuit, the capacitive element from the power source before connecting the capacitive element to the load capacitor.

The method may comprise charging the capacitive element and connecting the capacitive element to the load capacitor such that the oscillating voltage signal is temporarily increased when the oscillating voltage signal has a maximum voltage value or when the oscillating voltage signal is decreasing. Alternatively or additionally, the method may comprise charging the capacitive element and connecting the capacitive element to the load capacitor such that the oscillating voltage signal is temporarily decreased when the oscillating voltage signal has a minimum voltage value or when the oscillating voltage signal is increasing.

The method may comprise connecting the capacitive element with a first polarity to the load capacitor when the oscillating voltage signal has the maximum voltage value or when the oscillating voltage signal is decreasing. Or, the method may comprise connecting the capacitive element with a second polarity to the load capacitor when the oscillating voltage signal has the minimum voltage value or when the oscillating voltage signal is increasing. The first polarity may be reversed with regard to the second polarity.

The oscillator circuit may comprise another capacitive element. The method may comprise connecting, when the oscillating voltage signal has a maximum voltage value or when the oscillating voltage signal is decreasing, the capacitive element to the load capacitor. The method may comprise disconnecting, when the oscillating voltage signal has a maximum voltage value or when the oscillating voltage signal is decreasing, the other capacitive element from the load capacitor. The method may comprise connecting, when the oscillating voltage signal has a minimum voltage value or when the oscillating voltage signal is increasing, the other capacitive element to the load capacitor. The method may comprise disconnecting, when the oscillating voltage signal has a minimum voltage value or when the oscillating voltage signal is increasing, the capacitive element from the load capacitor. The method may comprise charging both the capacitive element and the other capacitive element, when the latter capacitive elements are disconnected from the load capacitor, using the same power source.

The method may comprise detecting a first-time instance at which the oscillating voltage signal reaches a maximum voltage value. The method may comprise detecting a second time instance at which the oscillating voltage signal reaches a minimum voltage value. The method may comprise determining a differentiated signal by differentiating the oscillating voltage signal. The method may comprise detecting a zero-crossing of the differentiated signal.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple", "connect", "coupled" or "connected" refers to elements being in electrical communication with each other, whether directly connected e.g., via wires, or in some other manner.

BRIEF DESCRIPTION OF THE DRAWINGS

The present invention is illustrated by way of example, and not by way of limitation, in the figures of the accompanying drawings in which like reference numerals refer to similar or identical elements, and in which

FIGS. 3A and 3B show two different implementations of a Pierce oscillator;

DESCRIPTION

Figures 1A, 1B:
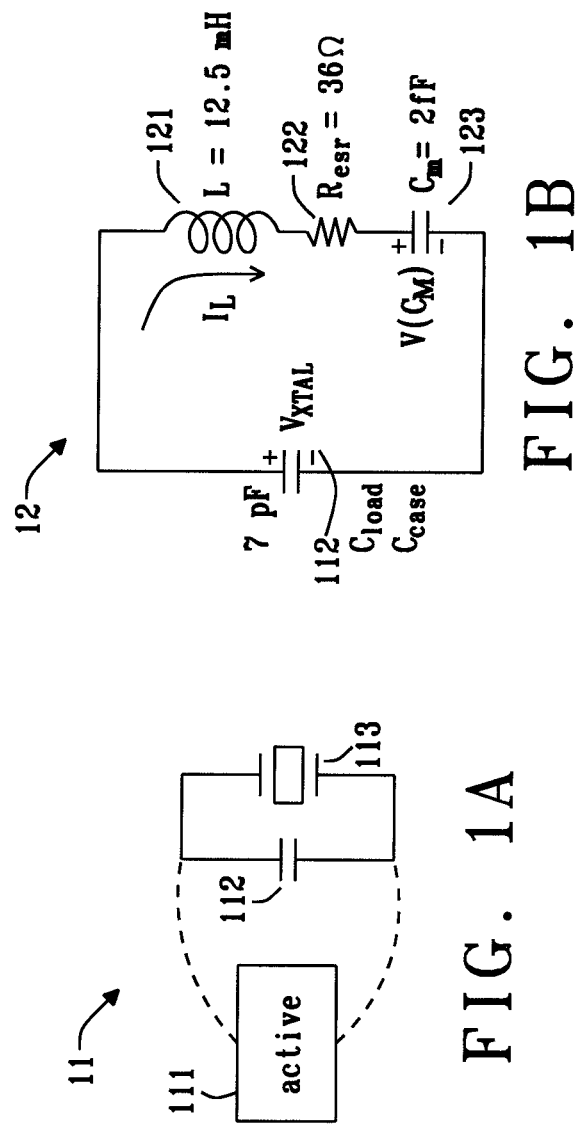
FIGS. 1A and 1B shows a general crystal oscillator and a corresponding equivalent circuit.
Figure 2A:
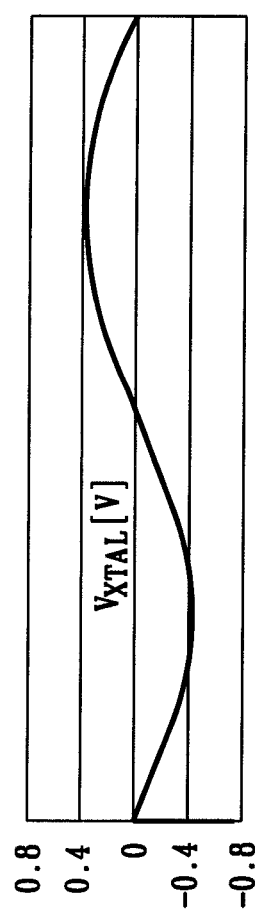
FIGS. 2A, 2B and 2C show waveforms of currents and voltages within a general crystal oscillator.
Figure 2B:
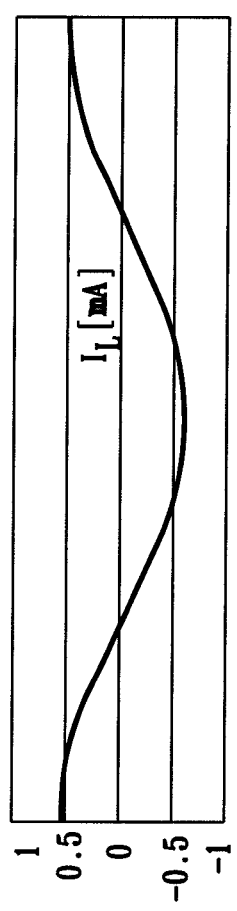
Figure 2C:
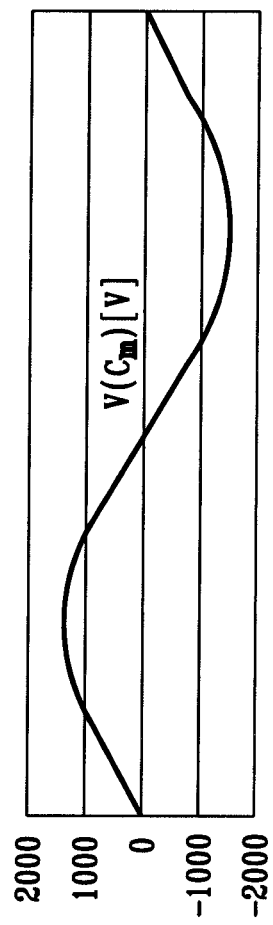

FIG. 1A shows a general crystal oscillator circuit 11, and FIG. 1B shows a corresponding equivalent circuit 12. The general crystal oscillator circuit 11 may comprise a Quartz crystal 113, a load capacitor 112, and an active element 111, wherein the active element 111 compensates for the losses in the Quartz crystal 113. The corresponding equivalent circuit 12 comprises an inductor 121, a resistor 122, and a capacitor 123. Typical numbers for a 32 MHz crystal oscillator are depicted in FIG. 1B. FIGS. 2A, 2B and 2c show waveforms of currents and voltages within the general crystal oscillator 11 of FIG. 1A.

FIGS. 3A and 3B show two different implementations of a Pierce oscillator. As can be seen in FIG. 3A, the active element in a Pierce oscillator may be an inverter 31 (push-pull). Alternatively, if power supply rejection ratio PSRR is important, a transistor 34 biased by a current source 35 may be used. This second alternative is illustrated in FIG. 3B. In both cases, the load capacitor is split into two capacitors 32 and 33 from each side of the crystal to ground. This capacitor split is needed for the circuit to work properly.

Figure 4:
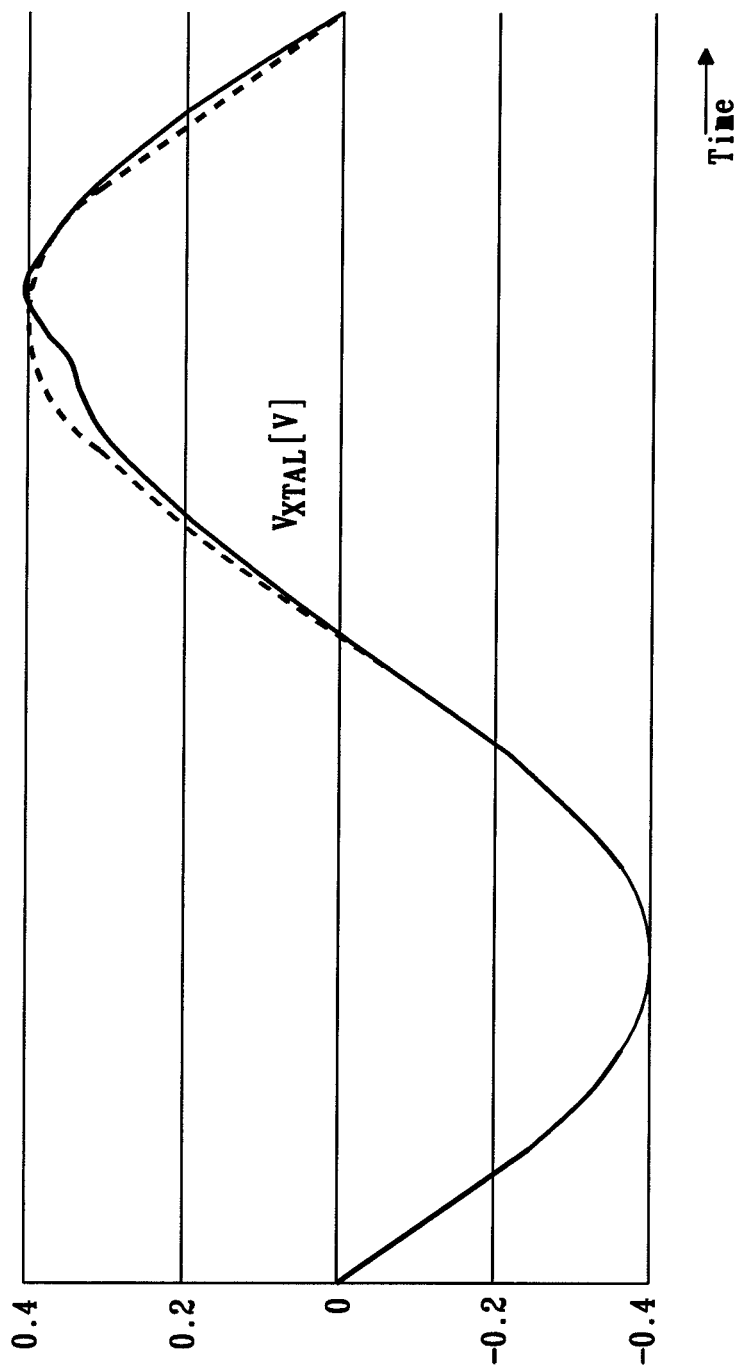
FIG. 4 shows typical waveforms of the voltages in a Pierce oscillator.

FIG. 4 shows typical waveforms of the voltages in a Pierce oscillator. More specifically, FIG. 4 illustrates the voltage $V_{XTAL}$ over the crystal when the transistor-based Pierce oscillator on the right hand side of FIG. 3 is used. At each peak at the input of the crystal, the output of the inverter is slightly pulled low by the transistor 34. This means that at each peak of the voltage $V_{XTAL}$, the negative side of the voltage $V_{XTAL}$ is reduced, resulting in a slight increase of the voltage $V_{XTAL}$. In this way, a little bit of energy is added to the LRC circuit, which compensates for the losses in the resistance R of the crystal. During the remainder of the period, the current source 35 recharges the output of the inverter to keep the DC-level constant over time.

The circuits depicted in FIG. 3 represent the standard way of implementing a crystal oscillator. However, there are still a few limitations and drawbacks of this oscillator.

A first drawback is the required circuit area. A consequence of the split of the load capacitor is that the crystal sees a series connection of the capacitors, which means that four times as much capacitance is needed to achieve the same effective load capacitance. Usually, the capacitors dominate the total area of the crystal oscillator, so this is a major disadvantage.

A second drawback is the circuit's vulnerability with regard to parasitic capacitances over the crystal. For a correct operation of the Pierce oscillator, the load capacitance must be split into two series capacitors. For a parasitic capacitor over the crystal (which may be caused by the crystal itself and/or by connecting wires), this can be difficult or expensive to do. For instance, a crystal with only two pins is smaller (and cheaper) than a crystal with an additional pin for the casing (to be able to ground the case and thereby splitting the case capacitance into two capacitors). Furthermore, to route the wires from a crystal to the chip next to each other is easier and smaller than to have them shielded by a ground wire in between. So, it is a compromise between performance and printed circuit board (PCB) space. As will be discussed in the following paragraphs, this may be different with the present invention: The smaller two-pin crystal can be used, and the wires can be routed next to each other, without impact on the performance. This may result in a smaller total circuit and an easier PCB design.

A third drawback is the power consumption of the conventional Pierce oscillator. The voltage over the current source 35 of a Pierce oscillator is on average equal to about half of the supply voltage and much more than the voltage in the valleys of the voltage $V_{XTAL}$. So, a significant amount of power is not transferred to the crystal but is in fact dissipated in the current source 35.

Finally, a fourth drawback concerns the generated noise. Although often negligible, the current source 35 and the transistor 34 of a conventional Pierce oscillator add some noise to the crystal.

Figure 5:
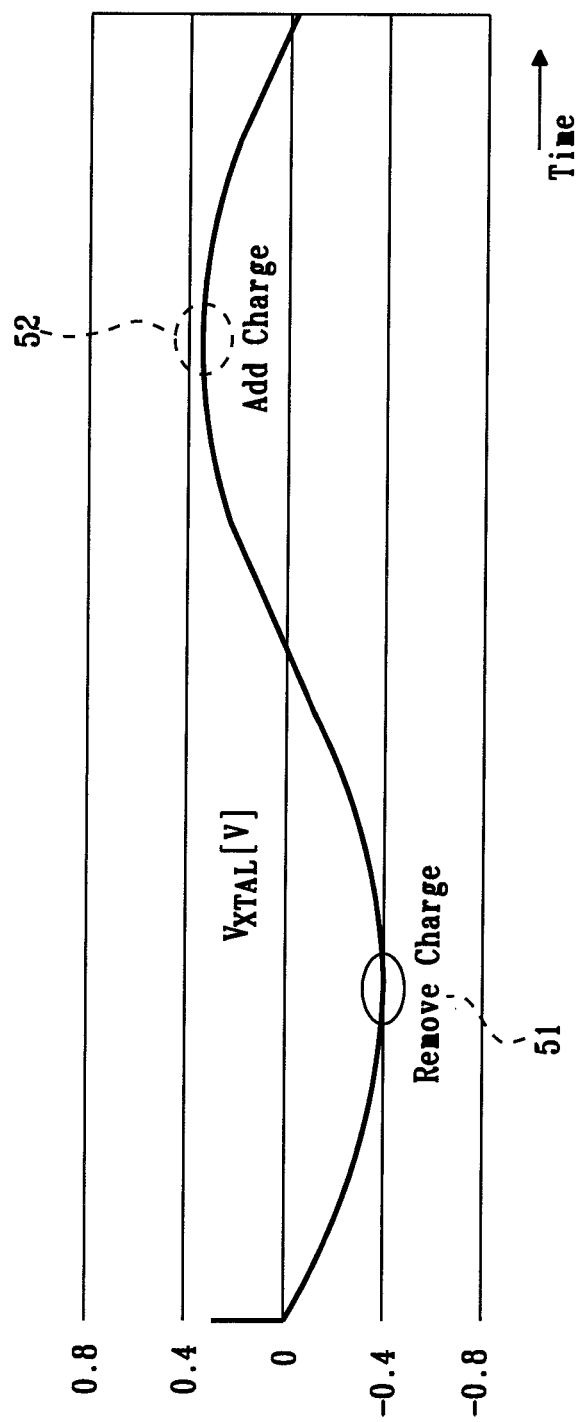
FIG. 5 shows the best moments to add or remove charge from a load capacitor.

In general, it is the duty of the active element 111 to add energy to the passive circuit components comprising the load capacitor 112 and the crystal 113. We only have access to the terminals of the load capacitor 112. The equivalent inductor 121, motional capacitance 123 and resistance 122 are inside the crystal 113 and not directly accessible. This means we can only add energy to the load capacitor 112. The most effective moments to add energy to the load capacitor 112 are during the peaks (positive and/or negative peak) of the voltage $V_{XTAL}$. The negative peak of the voltage $V_{XTAL}$ may also be denoted as valley within this document. FIG. 5 shows the best moments to add or remove charge from a load capacitor 112: At time 51, the voltage $V_{XTAL}$ (oscillating voltage signal) reaches its minimum voltage value (valley voltage). And at time 52, the voltage $V_{XTAL}$ (oscillating voltage signal) reaches its maximum voltage value (peak voltage).

In the conventional Pierce oscillator energy is added by short current pulses flowing into the load capacitor. However, you can also achieve the same effect by replacing a small part of the load capacitor by another pre-charged similar capacitor at the peaks and valleys of the voltage $V_{XTAL}$. The charge will redistribute as soon as the small charged capacitor (denoted as capacitive element in the following description) is connected to the rest of the load capacitor. For the next half period (from top to valley or from valley to top), the disconnected capacitive element may be recharged, ready to be swapped-in at the next peak or valley. For example, during a peak, a positively charged capacitive element may be swapped-in, and, at the valleys, a negatively charged capacitive element may be swapped-in. Alternatively, a positively charged capacitive element may be flipped before it is swapped-in. This is depicted in FIG. 6.

Figure 6:
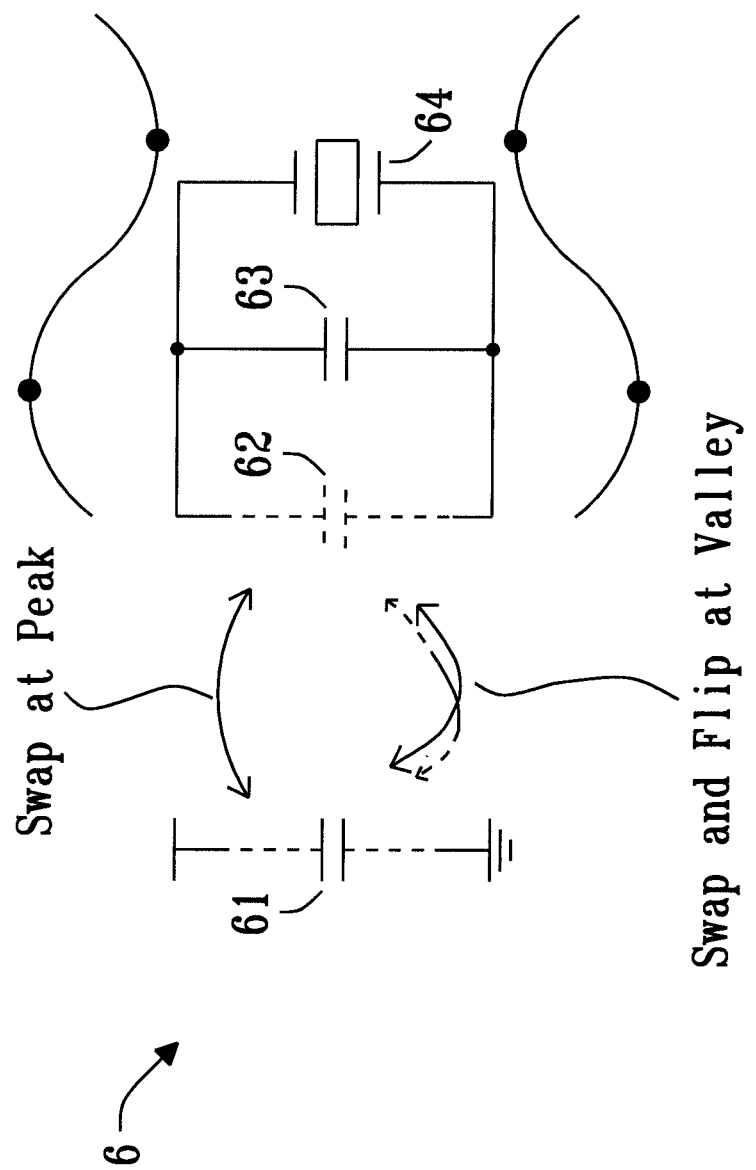
FIG. 6 shows an exemplary switched capacitor oscillator with a single capacitive element.

FIG. 6 shows an exemplary switched capacitor oscillator 6 with a single capacitive element. The switched capacitor oscillator 6 comprises a crystal 64 configured to generate an oscillating voltage signal, a load capacitor 63 coupled to the crystal 64, and a capacitive element 62. The switched capacitor oscillator 6 also comprises a switching circuit which is not explicitly illustrated in FIG. 6. Instead, the switching circuit is implicitly illustrated in FIG. 6 with the help of various arrows. The switching circuit may be configured to alternately connect the capacitive element 62 to the load capacitor 63, and to disconnect the capacitive element 62 from the load capacitor 63.

Figure 7:
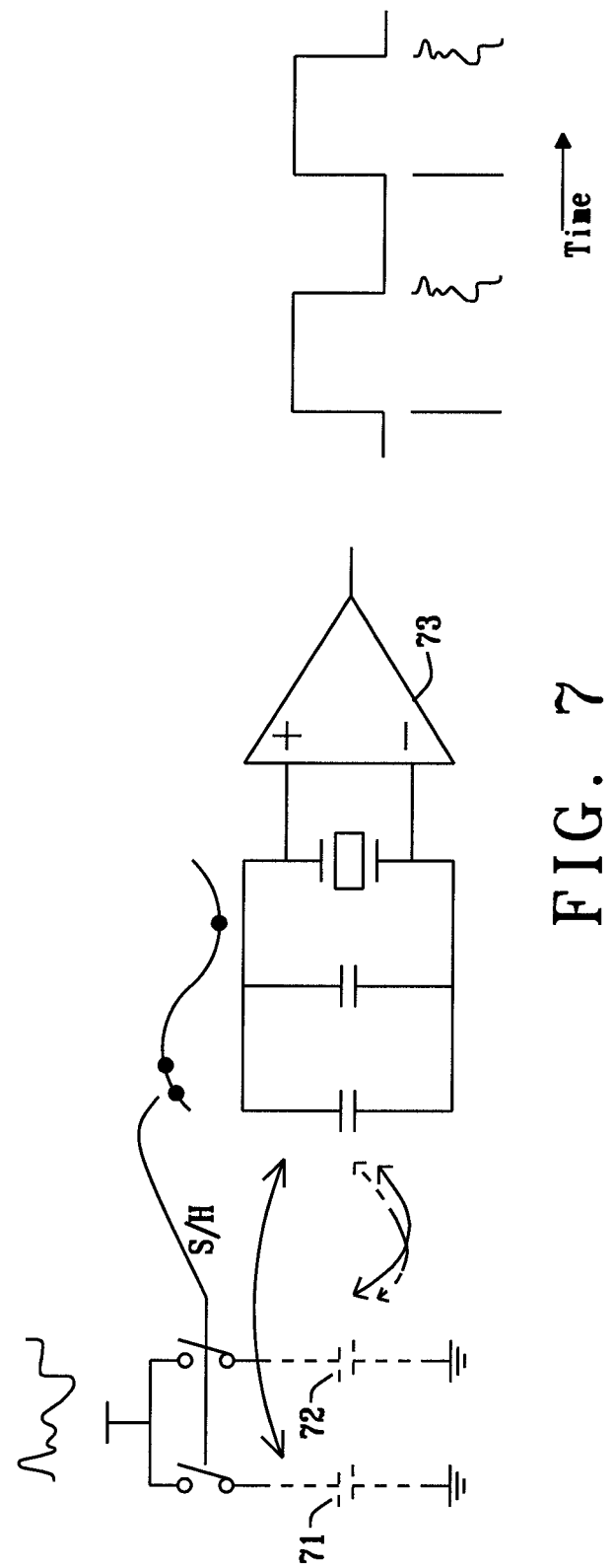
FIG. 7 shows another exemplary switched capacitor oscillator with two capacitive elements.
Figure 8:
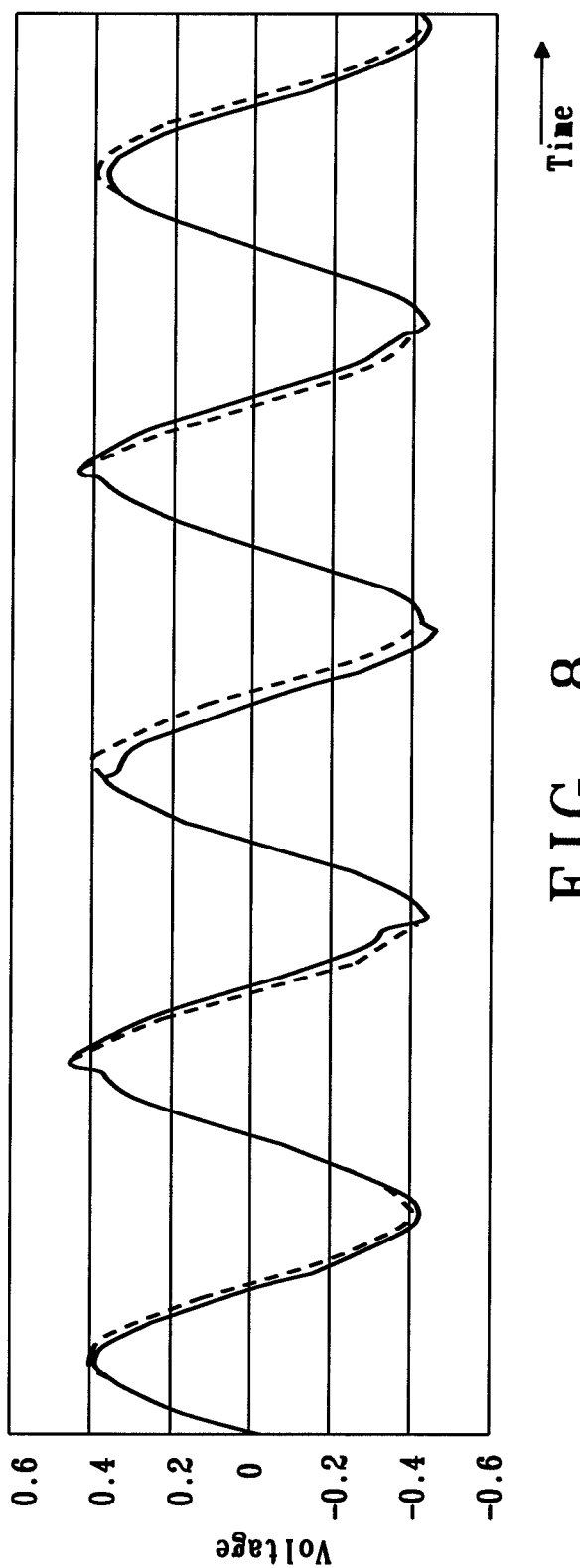
FIG. 8 shows waveforms of the exemplary switched capacitor oscillator illustrated in FIG. 7.

FIG. 7 illustrates an improvement of the above principle, wherein two capacitive elements 71, 72 are simultaneously charged and one capacitive element 71 is swapped in at the peak and the other capacitive element 72 is swapped in at the valley. This makes the circuit immune to variation and noise on the supply voltage, at least for either the rising or the falling edge: A sampled error that is added at the peak is subtracted in the valley, cancelling-out the error. In other words, either the rising edge or the falling edge of a clock signal (generated from the oscillating voltage signal e.g. using a comparator 73 as depicted in FIG. 7) is jitter-free. This improvement is also illustrated in FIG. 8, where an ideal crystal voltage is shown using a dashed line, and where the crystal voltage for a scenario with a noisy supply voltage is shown with a solid line. The skilled person will readily understand that the distortion on the supply voltage in FIG. 8 is illustrated in an exaggerated manner for the sake of easier presentation.

Figure 9:
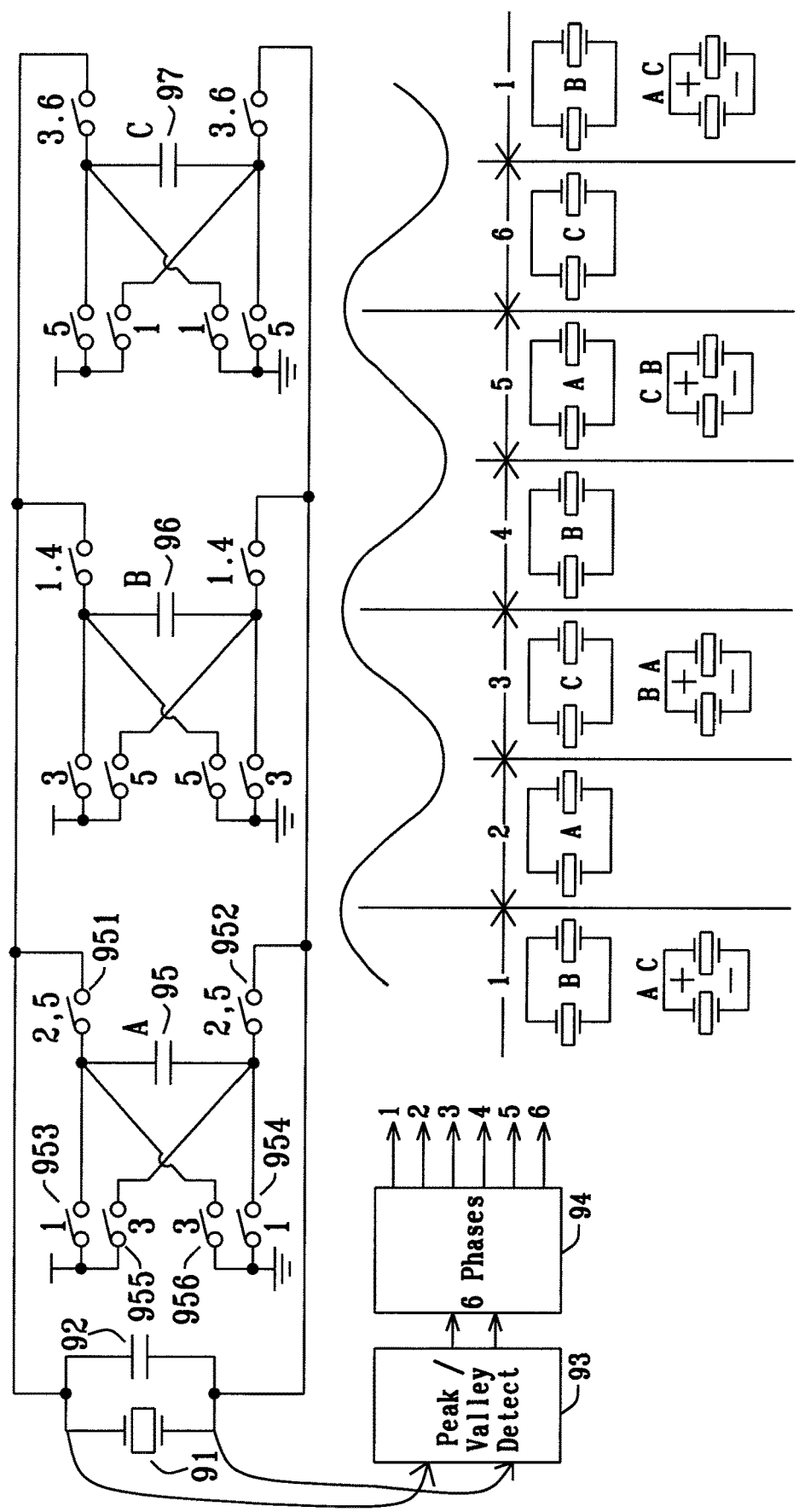
FIG. 9 shows another exemplary switched capacitor oscillator with three capacitive elements.

There are several options to implement the switched capacitor oscillator presented within this document. One potential implementation is depicted in FIG. 9. The example in FIG. 9 comprises three capacitive elements 95, 96, 97 (also denoted A, B and C). Capacitive element 95 may be connected to the crystal 91 using the first switching element 951 and the second switching element 952. Capacitive element 95 may be charged with a first polarity using the third switching element 953 and the fourth switching element 954. Capacitive element 95 may be charged with a second, opposite polarity using the fifth switching element 955 and the sixth switching element 956. Similarly, capacitive elements 96 and 97 may be connected to the crystal 91 or may be recharged with different polarities as described above.

One of the capacitive elements is connected in parallel to the crystal 91 and to the load capacitor 92. The other two capacitive elements are recharged during the rising edge of the voltage $V_{XTAL}$ (which is schematically illustrated in the bottom right of FIG. 9). A capacitive element that is swapped-out at a peak is positively recharged (voltage was already at the peak, so only a little charge must be added). This capacitive element will be swapped-in at the next peak. In a similar way, a capacitive element that is swapped-out at a valley is negatively charged and swapped-in at the next valley. This process repeats itself after 6 phases (3 periods). The illustrated example also comprises a peak/valley detection unit 93 (extreme voltage detection unit) and a control unit 94 for controlling the switching behavior in the different phases.

Figure 10:
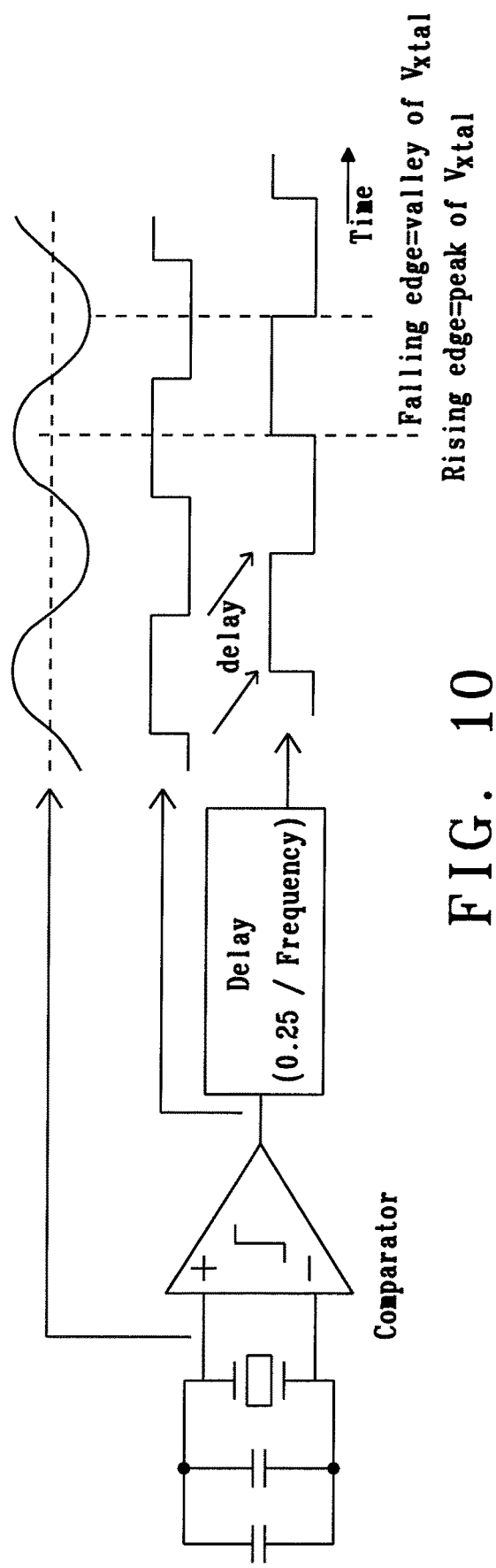
FIG. 10 shows a first example of an extreme voltage detection unit.

One way to detect peaks and valleys is to add a delay of 25% of a typical period to the zero-crossing of the voltage $V_{XTAL}$. FIG. 10 shows a first example of an extreme voltage detection unit which is based on this principle. The zero-cross comparator is often implemented anyway to generate a digital clock from the crystal signal, so the comparator doesn't add circuitry. The actual delay is not too critical, exactly 25% is ideal, but the circuit will still work if it is less or more (in theory it can work between 1% and 49%, but in practice the delay should be between about 15% and 35%: This should be possible without too much effort).

Figure 11:
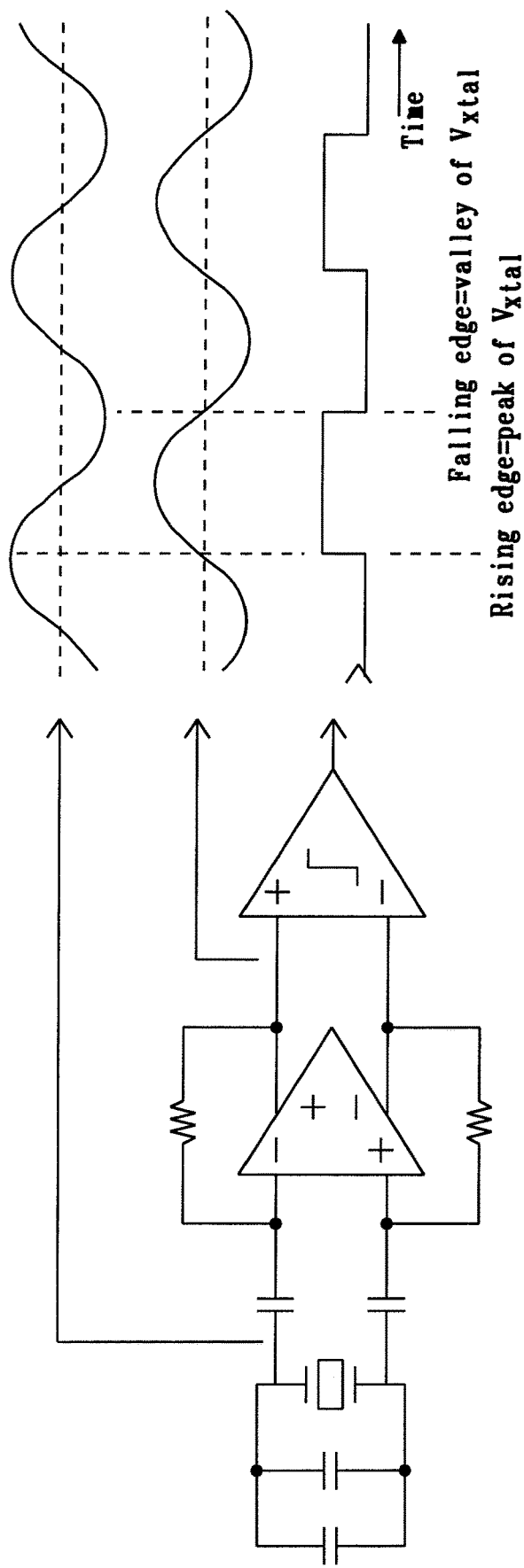
FIG. 11 shows a second example of an extreme voltage detection unit.
Figure 12:
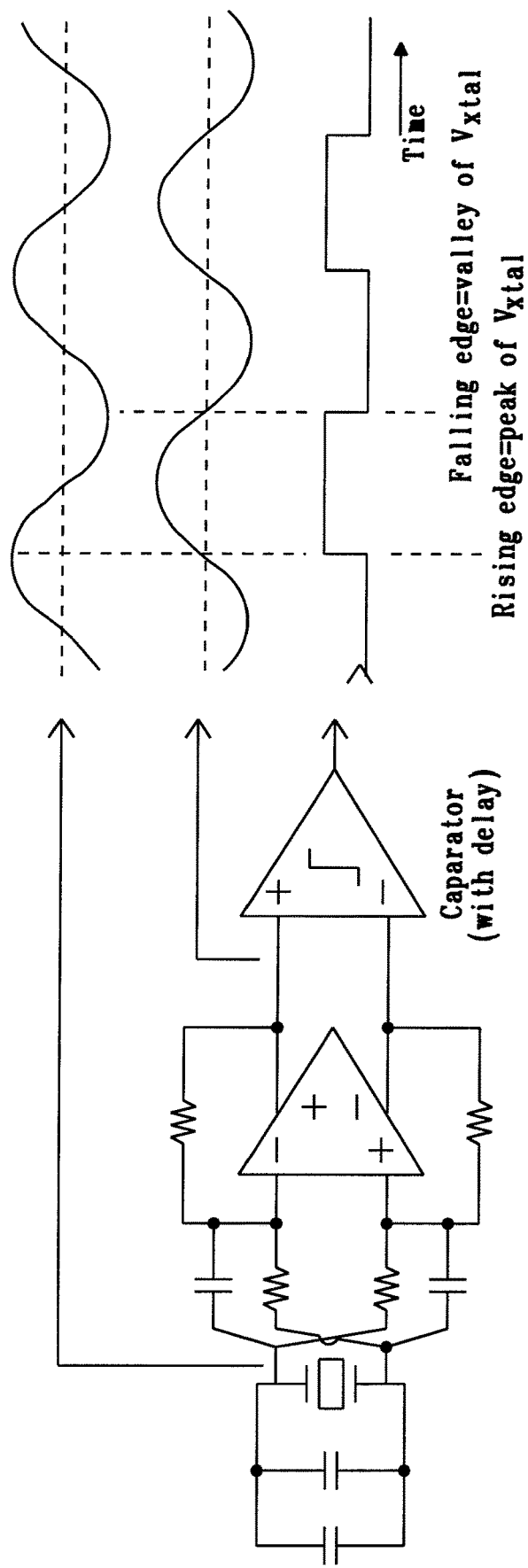
FIG. 12 shows a third example of an extreme voltage detection unit.

Another way to detect peaks and valleys is to differentiate the voltage over the crystal and to detect the zero-crossings of that differentiated signal. FIG. 11 shows a corresponding second example of an extreme voltage detection unit. In order to compensate for comparator delay and extra phase-shift due to a non-ideal operation amplifier, two resistors can be added to the circuit of FIG. 11. FIG. 12 shows a modified, third example of an extreme voltage detection unit with two additional resistors. With proper values for the extra resistors, the comparator output can be aligned exactly to the peaks/valleys of the crystal voltage $V_{XTAL}$.

Figure 13:
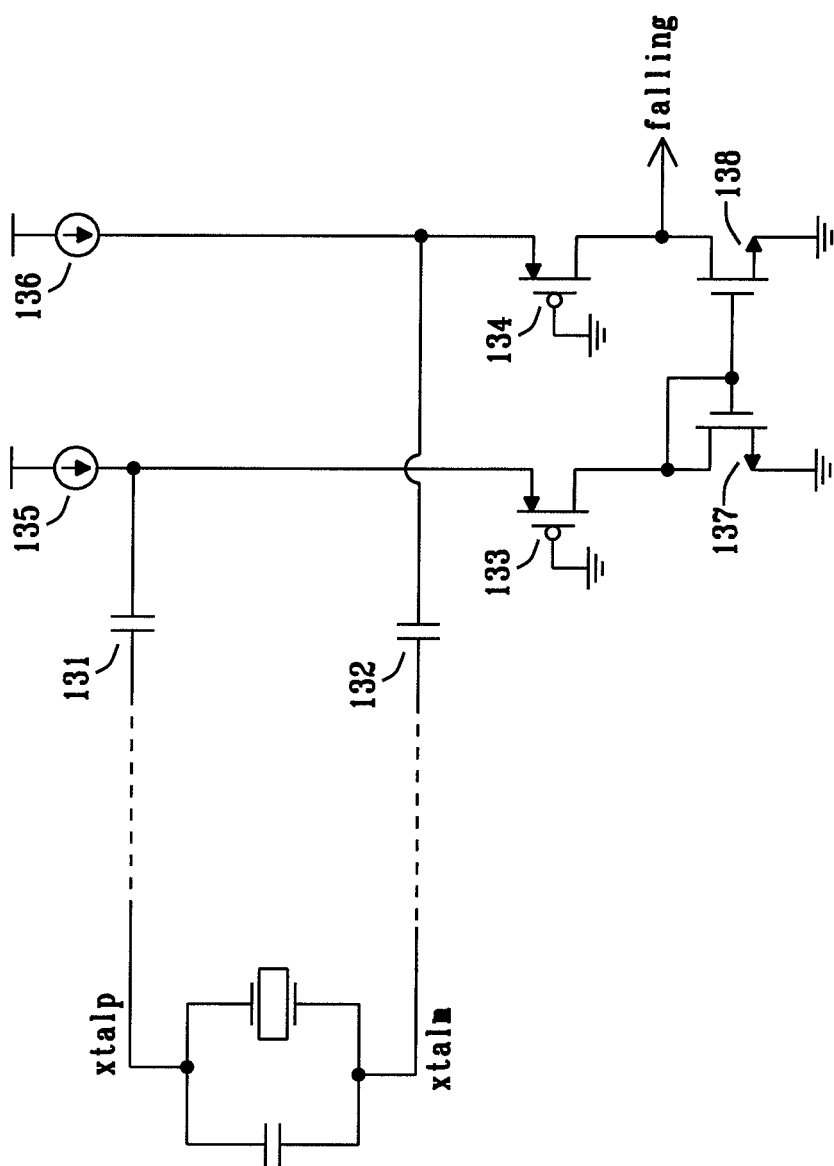
FIG. 13 shows a fourth example of an extreme voltage detection unit.

FIG. 13 shows a fourth example of an extreme voltage detection unit. The example comprises two current sources 135, 136 and two transistor 137, 138 forming a current mirror. The two capacitors 131, 132 act as differentiators. The two transistors 133, 134 create low-ohmic nodes for the capacitors 131, 132.

Figure 14:
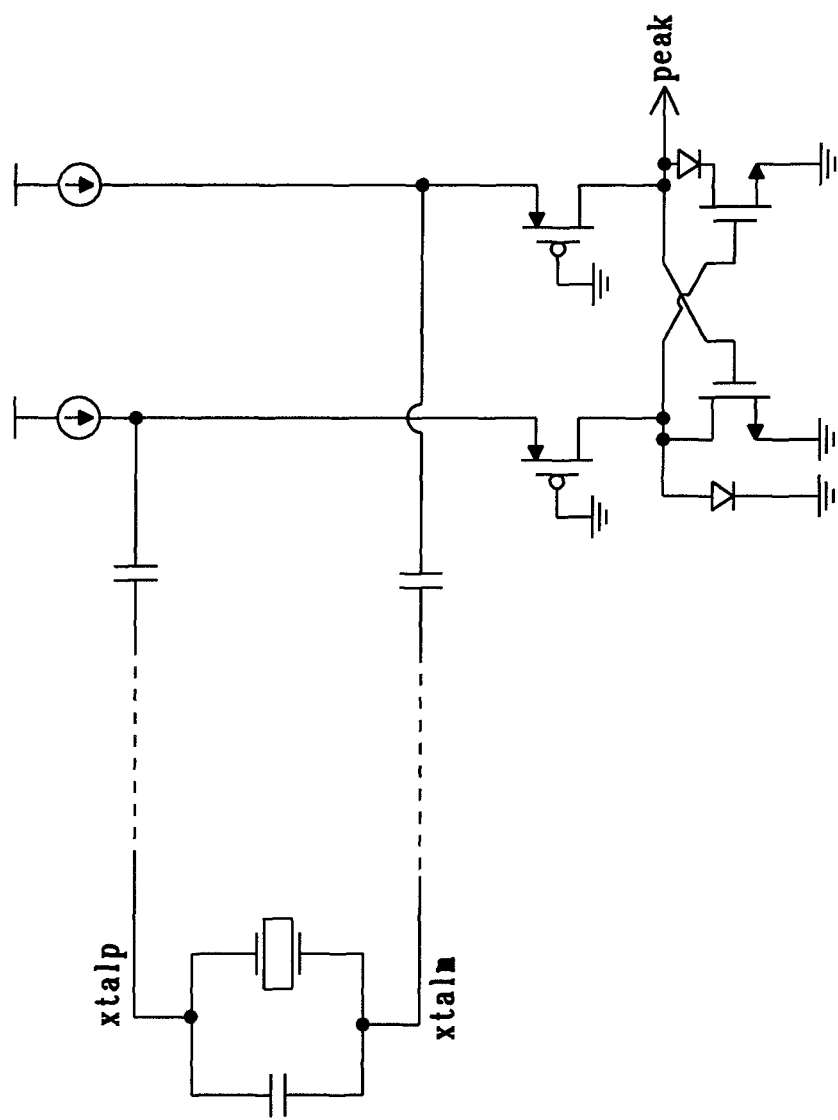
FIG. 14 shows a fifth example of an extreme voltage detection unit.
Figure 15:
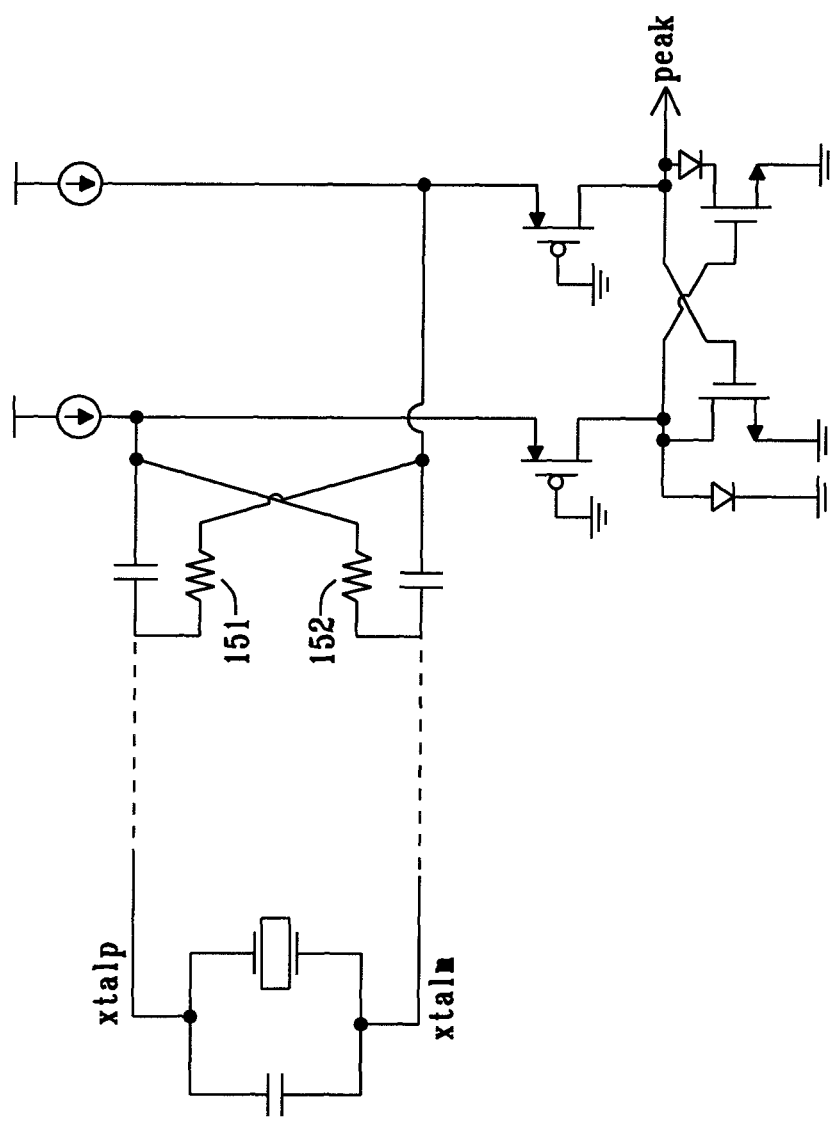
FIG. 15 shows a sixth example of an extreme voltage detection unit.

FIG. 14 shows a fifth example of an extreme voltage detection unit. In FIG. 4, the current mirror is replaced by a latch in order to improve the speed of the comparator. Finally, FIG. 15 shows a sixth example of an extreme voltage detection unit. FIG. 15 shows an improved version of the extreme voltage detection unit of FIG. 14, wherein two cross-connected resistors 151, 152 are added.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. An oscillator circuit comprising a crystal configured to generate an oscillating voltage signal, a capacitive element, and a switching circuit configured to
   connect the capacitive element to a power source for charging the capacitive element,
   connect the capacitive element in parallel with the crystal, and
   disconnect the capacitive element from the crystal.

2. The oscillator circuit of claim 1, wherein the switching circuit is configured to alternately connect and disconnect said capacitive element to and from the crystal such that the oscillating voltage signal continues oscillating with a given amplitude.

3. The oscillator circuit of claim 1, wherein the switching circuit comprises
   a first switching element configured to connect a first terminal of the capacitive element to a first terminal of the crystal, and
   a second switching element configured to connect a second terminal of the capacitive element to a second terminal of the crystal.

4. The oscillator circuit of claim 3, wherein the switching circuit comprises
   a third switching element configured to connect a first terminal of the capacitive element to a first terminal of the power source, and
   a fourth switching element configured to connect a second terminal of the capacitive element to a second terminal of the power source.

5. The oscillator circuit of claim 4, wherein the switching circuit comprises
   a fifth switching element configured to connect the first terminal of the capacitive element to the second terminal of the power source, and
   a sixth switching element configured to connect the second terminal of the capacitive element to the first terminal of the power source.

6. The oscillator circuit of claim 1, wherein the switching circuit is configured to, after disconnecting the capacitive element from the crystal,
   connect the capacitive element to the power source for charging the capacitive element.

7. The oscillator circuit of claim 1, wherein the oscillator circuit is configured to charge the capacitive element and connect the capacitive element to the crystal such that
the oscillating voltage signal is temporarily increased when the oscillating voltage signal has a maximum voltage value or when the oscillating voltage signal is decreasing, or
the oscillating voltage signal is temporarily decreased when the oscillating voltage signal has a minimum voltage value or when the oscillating voltage signal is increasing.

8. The oscillator circuit of claim 7, wherein the switching circuit is configured to
charge the capacitive element by connecting the capacitive element with a first polarity to the power source before connecting the capacitive element to the crystal when the oscillating voltage signal has the maximum voltage value or when the oscillating voltage signal is decreasing, or to
charge the capacitive element by connecting the capacitive element with a second polarity to the power source before connecting the capacitive element to the crystal when the oscillating voltage signal has the minimum voltage value or when the oscillating voltage signal is increasing,
wherein the first polarity is reversed with regard to the second polarity.

9. The oscillator circuit of claim 7, wherein the switching circuit is configured to
connect the capacitive element with a first polarity to the crystal when the oscillating voltage signal has the maximum voltage value or when the oscillating voltage signal is decreasing, or to
connect the capacitive element with a second polarity to the crystal when the oscillating voltage signal has the minimum voltage value or when the oscillating voltage signal is increasing,
wherein the first polarity is reversed with regard to the second polarity.

10. The oscillator circuit of claim 1, comprising another capacitive element, wherein the switching circuit is configured to
connect, when the oscillating voltage signal has a maximum voltage value or when the oscillating voltage signal is decreasing, the capacitive element to the crystal, and to
connect, when the oscillating voltage signal has a minimum voltage value or when the oscillating voltage signal is increasing, the other capacitive element to the crystal,
wherein the oscillator circuit is configured to simultaneously charge both the capacitive element and the other capacitive element using the same power source.

11. The oscillator circuit of claim 1, comprising an extreme voltage detection unit configured to detect
a first time instance at which the oscillating voltage signal reaches a maximum voltage value, or
a second time instance at which the oscillating voltage signal reaches a minimum voltage value.

12. The oscillator circuit of claim 11, wherein the extreme voltage detection unit is configured to
determine a differentiated signal by differentiating the oscillating voltage signal, and
detect a zero-crossing of the differentiated signal.

13. A method of operating an oscillator circuit, the oscillator circuit comprising a crystal for generating an oscillating voltage signal, a capacitive element, wherein the method comprises:
connecting, by a switching circuit, the capacitive element to a power source for charging the capacitive element,
connecting, by the switching circuit, the capacitive element in parallel with the crystal, and
disconnecting, by the switching circuit, the capacitive element from the crystal.

14. The method of claim 13, comprising
alternately connecting and disconnecting, by said switching circuit, said capacitive element to and from the crystal such that the oscillating voltage signal continues oscillating with a given amplitude.

15. The method of claim 13, wherein the switching circuit comprises a first switching element and a second switching element, and wherein the method comprises:
connecting, by the first switching element, a first terminal of the capacitive element to a first terminal of the crystal, and
connecting, by the second switching element, a second terminal of the capacitive element to a second terminal of the crystal.

16. The method of claim 15, wherein the switching circuit comprises a third switching element and a fourth switching element, and wherein the method comprises:
connecting, by the third switching element, a first terminal of the capacitive element to a first terminal of the power source, and
connecting, by the fourth switching element, a second terminal of the capacitive element to a second terminal of the power source.

17. The method of claim 16, wherein the switching circuit comprises a fifth switching element and a sixth switching element, and wherein the method comprises:
connecting, by the fifth switching element, the first terminal of the capacitive element to the second terminal of the power source, and
connecting, by the sixth switching element, the second terminal of the capacitive element to the first terminal of the power source.

18. The method of claim 13, wherein the method comprises:
connecting, by the switching circuit, after disconnecting the capacitive element from the crystal, the capacitive element to the power source for charging the capacitive element.

19. The method of claim 13, wherein the method comprises charging the capacitive element and connecting the capacitive element to the crystal such that
the oscillating voltage signal is temporarily increased when the oscillating voltage signal has a maximum voltage value or when the oscillating voltage signal is decreasing, or
the oscillating voltage signal is temporarily decreased when the oscillating voltage signal has a minimum voltage value or when the oscillating voltage signal is increasing.

20. The method of claim 1, wherein the method comprises
charging the capacitive element by connecting the capacitive element with a first polarity to the power source before connecting the capacitive element to the crystal when the oscillating voltage signal has the maximum voltage value or when the oscillating voltage signal is decreasing, or charging the capacitive element by connecting the capacitive element with a second polarity to the power source before connecting the capacitive element to the crystal when the oscillating voltage signal has the minimum voltage value or when the oscillating voltage signal is increasing, wherein the first polarity is reversed with regard to the second polarity.

21. The method of claim 19, wherein the method comprises connecting the capacitive element with a first polarity to the crystal when the oscillating voltage signal has the maximum voltage value or when the oscillating voltage signal is decreasing, or connecting the capacitive element with a second polarity to the crystal when the oscillating voltage signal has the minimum voltage value or when the oscillating voltage signal is increasing, wherein the first polarity is reversed with regard to the second polarity.

22. The method of claim 13, wherein the oscillator circuit comprises another capacitive element, wherein the method comprises:

when the oscillating voltage signal has a maximum voltage value or when the oscillating voltage signal is decreasing, connecting the capacitive element to the crystal and disconnecting the another capacitive element from the crystal, when the oscillating voltage signal has a minimum voltage value or when the oscillating voltage signal is increasing, connecting the another capacitive element to the crystal and disconnecting the capacitive element from the crystal, and charging both the capacitive element and the another capacitive element, when the latter capacitive elements are disconnected from the crystal, using the same power source.

23. The method of claim 13, comprising:

detecting a first time instance at which the oscillating voltage signal reaches a maximum voltage value, or detecting a second time instance at which the oscillating voltage signal reaches a minimum voltage value.

24. The method of claim 13, comprising:

determining a differentiated signal by differentiating the oscillating voltage signal, and detecting a zero-crossing of the differentiated signal.

* * * * *